US012322611B2

(12) United States Patent
Nakagawa

(10) Patent No.: US 12,322,611 B2
(45) Date of Patent: Jun. 3, 2025

(54) SEMICONDUCTOR MANUFACTURING DEVICE AND METHOD OF USING THE SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Keiji Nakagawa, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 636 days.

(21) Appl. No.: 17/688,103

(22) Filed: Mar. 7, 2022

(65) Prior Publication Data

US 2023/0093400 A1    Mar. 23, 2023

(30) Foreign Application Priority Data

Sep. 22, 2021    (JP) ................................ 2021-154480

(51) Int. Cl.
*H01L 21/67*    (2006.01)
*H01L 21/683*    (2006.01)
*H01L 21/78*    (2006.01)

(52) U.S. Cl.
CPC .... *H01L 21/67092* (2013.01); *H01L 21/6836* (2013.01); *H01L 21/78* (2013.01)

(58) Field of Classification Search
CPC .......... H01L 21/67092; H01L 21/6836; H01L 21/78
See application file for complete search history.

(56) References Cited

U.S. PATENT DOCUMENTS

| 4,575,229 A | 3/1986 | Lundstrom |
| 2002/0067982 A1 | 6/2002 | Yasumura et al. |
| 2006/0285965 A1 | 12/2006 | Kabeshita et al. |
| 2013/0095613 A1 | 4/2013 | Tanaka |

(Continued)

FOREIGN PATENT DOCUMENTS

| JP | H05-335405 A | 12/1993 |
| JP | H06-338527 A | 12/1994 |

(Continued)

*Primary Examiner* — Monica D Harrison
*Assistant Examiner* — Andre C Stevenson
(74) *Attorney, Agent, or Firm* — Kim & Stewart LLP

(57) ABSTRACT

A semiconductor manufacturing device includes a table having an upper face on which a frame having a first opening to which a substrate is fixed by an adhesive is disposed, the table having a plurality of first through holes penetrating the table in a vertical direction and provided side by side in a first direction parallel to the upper face and a plurality of second through holes each provided between the adjacent first through holes and penetrating the table in the vertical direction; and a container provided on the table, the container including a first sidewall provided on the frame, a second sidewall provided on the frame, the second sidewall facing the first sidewall, a distance between the second sidewall and the first sidewall being larger than a first inner diameter of the first opening, and a joint allowing an outside of the container and an inside of the container to communicate with each other.

14 Claims, 5 Drawing Sheets

(56) References Cited

U.S. PATENT DOCUMENTS

| | | |
|---|---|---|
| 2014/0027049 A1 | 1/2014 | Joo et al. |
| 2018/0090351 A1* | 3/2018 | Takada et al. |
| 2019/0025370 A1* | 1/2019 | Kobayashi ......... G01R 31/2877 |
| 2020/0171707 A1 | 6/2020 | Masada et al. |
| 2023/0384694 A1* | 11/2023 | Alikhan ................ G03F 7/7095 |

FOREIGN PATENT DOCUMENTS

| | | |
|---|---|---|
| JP | H11-054594 A | 2/1999 |
| JP | 2002-164305 A | 6/2002 |
| JP | 3484936 B2 | 1/2004 |
| JP | 2005-085928 A | 3/2005 |
| JP | 2009-277837 A | 11/2009 |
| JP | 2010-272627 A | 12/2010 |
| JP | 2011-129821 A | 6/2011 |
| JP | 2011-228473 A | 11/2011 |
| JP | 2013-102126 A | 5/2013 |
| JP | 5464532 B2 | 4/2014 |
| JP | 2014-116455 A | 6/2014 |
| JP | 2018-056159 A | 4/2018 |
| JP | 2020-096177 A | 6/2020 |
| JP | 2021-136257 A | 9/2021 |

\* cited by examiner

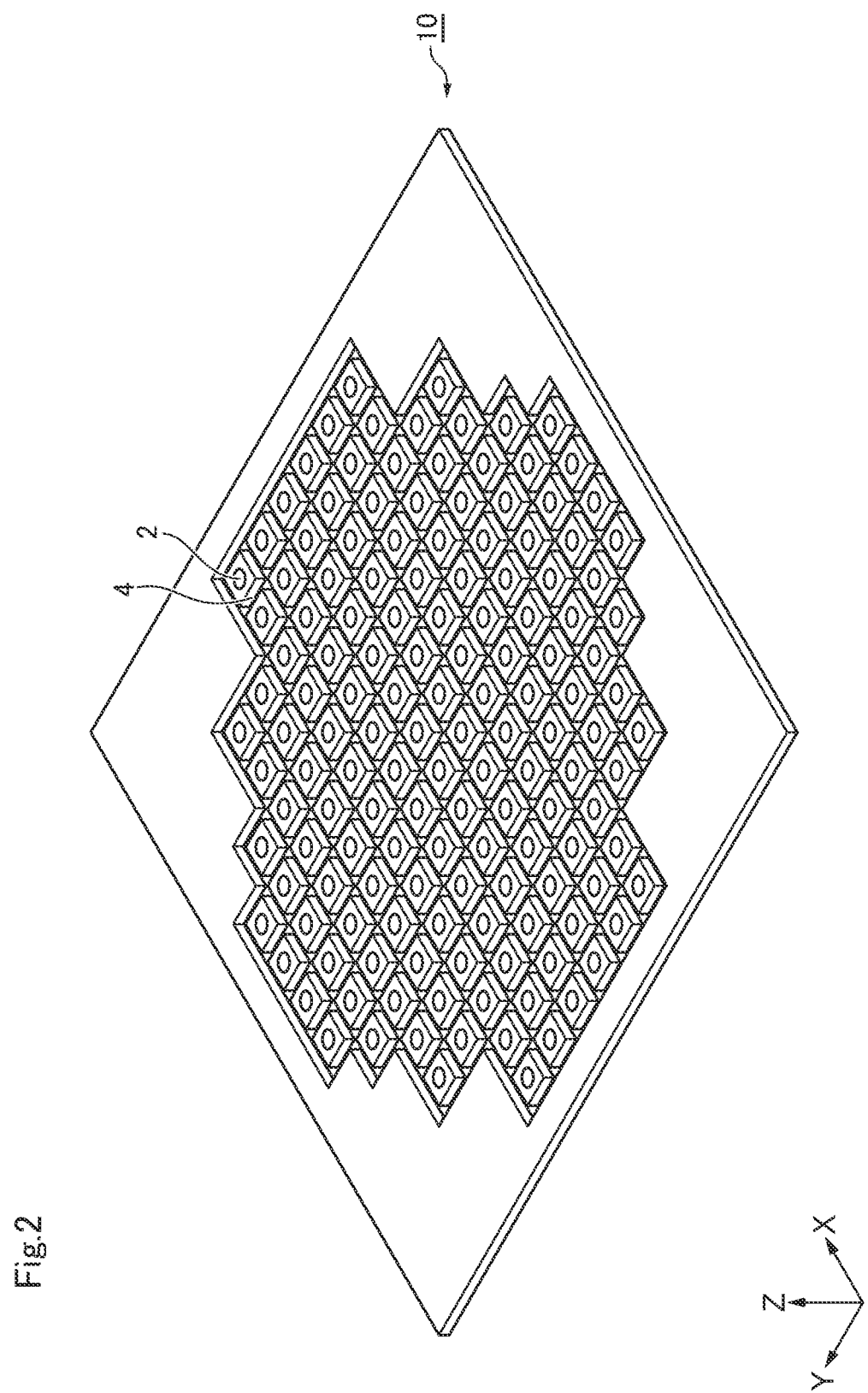

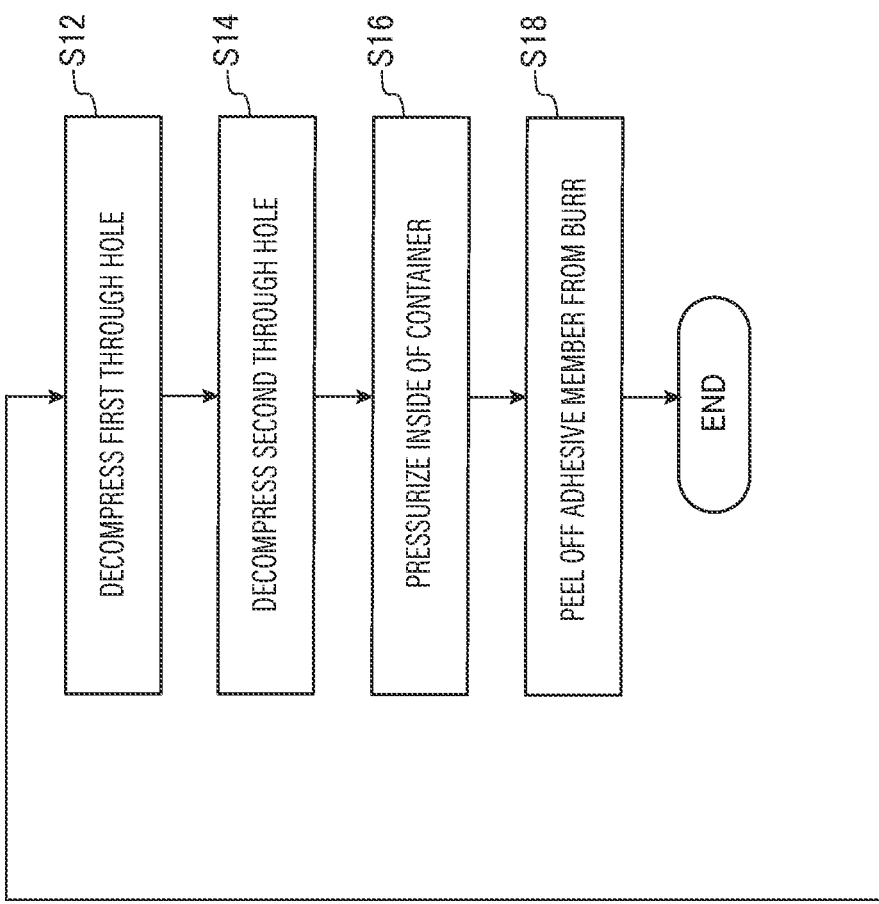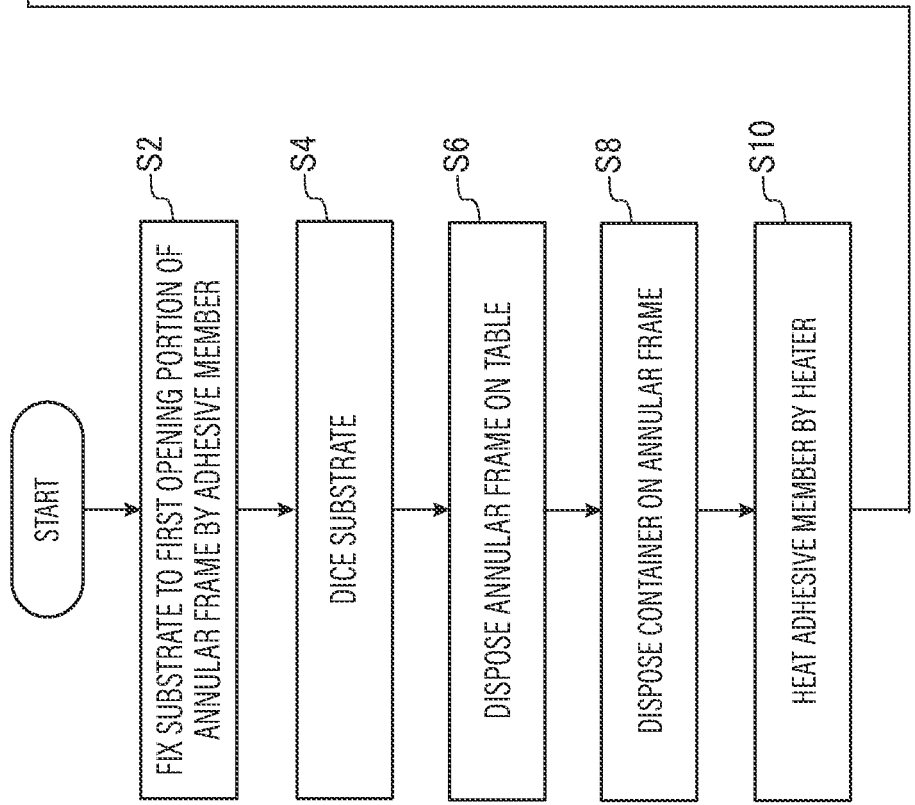

SEMICONDUCTOR MANUFACTURING DEVICE AND METHOD OF USING THE SAME

CROSS-REFERENCE TO RELATED APPLICATION

This application is based upon and claims the benefit of priority from Japanese Patent Application No. 2021-154480, filed on Sep. 22, 2021, the entire contents of which are incorporated herein by reference.

FIELD

Embodiments described herein relate generally to a semiconductor manufacturing device and a method of using the semiconductor manufacturing device.

BACKGROUND

In manufacturing a semiconductor device, after a predetermined process of forming a semiconductor device is performed on a substrate such as a semiconductor wafer, the substrate is fixed to an opening portion of an annular frame (dicing frame) having an opening portion having a diameter larger than a diameter of the substrate using an adhesive member. The substrate fixed to the annular frame is pieced by a predetermined dicing process. Thereafter, the pieced substrate is peeled off from the adhesive member.

BRIEF DESCRIPTION OF THE DRAWINGS

FIG. 2 is a schematic perspective view of a table of the embodiment;

FIG. 4 is a flowchart of a method for using the semiconductor manufacturing device according to the embodiment.

DETAILED DESCRIPTION

Figure 1:
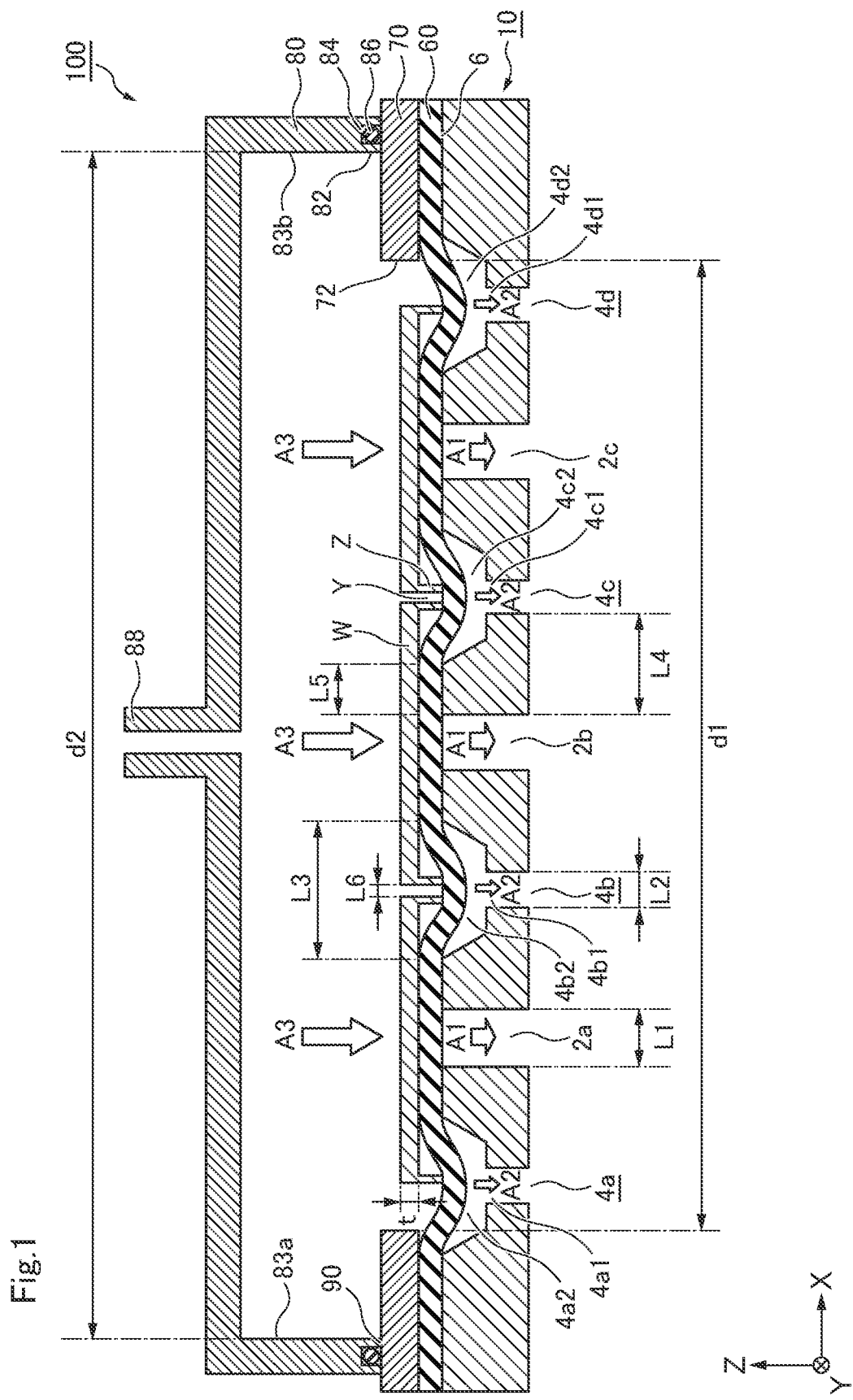
FIG. 1 is a schematic cross-sectional view of a semiconductor manufacturing device according to the embodiment.

Hereinafter, embodiments of the present disclosure will be described with reference to the drawings. In the following description, the same members and the like are denoted by the same reference numerals, and the description of the members and the like once described is appropriately omitted.

In the present specification, the upper direction of the drawing is described as "upper" and the lower direction of the drawing as "lower" in order to indicate the positional relationship of parts and the like. In the present specification, the terms "upper" and "lower" are not necessarily terms indicating the relationship with the direction of gravity.

Embodiment

A semiconductor manufacturing device according to an embodiment includes a table having an upper face on which a frame having a first opening to which a substrate is fixed by an adhesive is disposed, the table having a plurality of first through holes penetrating the table in a vertical direction and provided side by side in a first direction parallel to the upper face and a plurality of second through holes each provided between the adjacent first through holes and penetrating the table in the vertical direction; and a container provided on the table, the container including a first sidewall provided on the frame, a second sidewall provided on the frame, the second sidewall facing the first sidewall, a distance between the second sidewall and the first sidewall being larger than a first inner diameter of the first opening, and a joint allowing an outside of the container and an inside of the container to communicate with each other.

A method of using a semiconductor manufacturing device according to an embodiment includes disposing an annular frame having a first opening portion to which a substrate having a dicing groove with a burr is fixed by an adhesive member on a table having a plurality of first through holes penetrating the table in a vertical direction and provided side by side in a first direction parallel to an upper face of the table, and a plurality of second through holes provided between the adjacent first through holes and penetrating the table in the vertical direction such that the dicing groove is disposed above each of the second through holes, disposing, on the annular frame, a container including a second opening portion provided at a lower part of the container, having a second inner diameter larger than a first inner diameter of the first opening portion, and being capable of being in close contact with the annular frame, and a joint allowing an outside of the container and an inside of the container to communicate with each other such that the second opening portion is brought into close contact with the annular frame, decompressing the first through holes, decompressing the second through holes, and pressurizing an inside of the container using the joint.

Figure 3B:
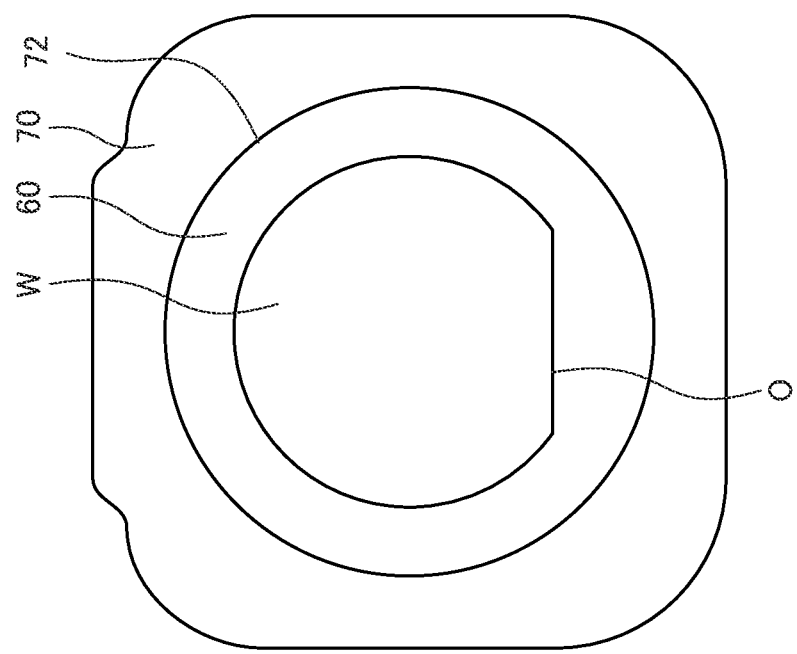
FIGS. 3A and 3B are schematic top views of a substrate and an annular frame before dicing according to the embodiment.
Figure 3A:
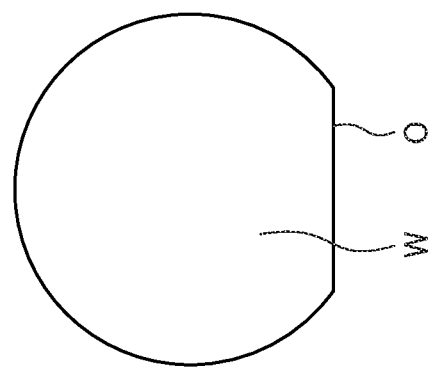

FIG. 1 is a schematic diagram of a semiconductor manufacturing device 100 according to the embodiment. FIG. 2 is a schematic perspective view of a table of the embodiment. FIGS. 3A and 3B are schematic top views of a substrate W and an annular frame 70 before dicing according to the embodiment. FIG. 3A is a schematic top view of the substrate W before dicing according to the embodiment. FIG. 3B is a schematic top view of the annular frame 70 of the embodiment.

With reference to FIGS. 1, 2, 3A, and 3B, a semiconductor manufacturing device 100 according to the embodiment will be described.

The substrate W is, for example, a silicon (Si) wafer, a silicon carbide (SiC) wafer, a gallium arsenide (GaAs) wafer, a gallium nitride (GaN) wafer, or the like. The substrate W may be provided with an orientation flat O indicating the crystal orientation.

FIG. 1 illustrates the substrate W after dicing. A dicing groove Y having a burr Z is formed at an end of the pieced substrate W after dicing. The width of the dicing groove Y is L6. FIGS. 3A and 3B illustrate the substrate W before dicing.

The semiconductor manufacturing device according to the embodiment and the method of using the semiconductor manufacturing device are preferably applied when the thickness t of the substrate W is 75 µm or less.

The annular frame 70 has a first opening portion 72. The substrate W is fixed inside the first opening portion 72 using an adhesive member 60. Then, in this state, dicing of the substrate W is performed.

The adhesive member 60 is used for fixing the substrate W and fixing the substrate W after being pieced by dicing. The adhesive member 60 is, for example, a dicing tape.

The semiconductor manufacturing device 100 of the present embodiment is used, for example, before the substrate W diced by a dicing device (dicer) and pieced is peeled off from the adhesive member 60 by a pickup device. Note that the semiconductor manufacturing device 100 may be used in combination with, for example, the dicing device (dicer). Further, the semiconductor manufacturing device 100 may be used in combination with the pickup device, for example. Furthermore, the semiconductor manufacturing device 100 may be provided separately from, for example, the dicing device (dicer) and the pickup device.

Here, an X direction, a Y direction perpendicular to the X direction, and a Z direction perpendicular to the X direction and the Y direction are defined. In FIGS. 3A and 3B, the substrate W is illustrated assuming that the substrate face of the substrate W is disposed parallel to the XY plane and the orientation flat O is disposed parallel to the X direction. In FIG. 3B, the annular frame 70 and the substrate W are illustrated assuming that the plane of the annular frame F is disposed parallel to the XY plane. For example, the X direction is an example of a first direction, and the Y direction is an example of a second direction.

The semiconductor manufacturing device 100 includes a table 10 and a container 80.

The table 10 has a plurality of first through holes 2, a plurality of second through holes 4, and an upper face 6.

The annular frame 70 to which the substrate W is fixed is disposed on the upper face 6. The upper face 6 is disposed, for example, parallel to the XY plane. In FIG. 2, the shape of the upper face 6 in a plane parallel to the XY plane is a square. However, the shape of the upper face 6 in a plane parallel to the XY plane is, of course, not limited to a square.

Each of the plurality of first through holes 2 penetrates the table 10 in the Z direction (vertical direction). The plurality of first through holes 2 is provided side by side in the X direction and the Y direction parallel to the upper face 6. The plurality of first through holes 2 is provided for sucking the pieced substrate W via the adhesive member 60. The number of the plurality of first through holes 2 is at least two or more.

The plurality of second through holes 4 is provided between the plurality of first through holes 2. Each of the plurality of second through holes 4 is provided between two first through holes 2 of the plurality of first through holes. The plurality of second through holes 4 penetrates the table 10 in the Z direction (vertical direction). The plurality of second through holes 4 is provided to peel off the adhesive member 60 from the burr Z by pressure reduction.

The number of the plurality of first through holes 2 and the number of the plurality of second through holes 4 in FIG. 1 are illustrated to be smaller than the number of the plurality of first through holes 2 and the number of the plurality of second through holes 4 illustrated in FIG. 2 in order to facilitate illustration by the cross-sectional view. The number of the plurality of first through holes 2 and the number of the plurality of second through holes 4 are not limited to those illustrated in FIGS. 1 and 2. FIG. 1 illustrates a first through hole 2a, a first through hole 2b, and a first through hole 2c as the plurality of first through holes 2. In addition, FIG. 1 illustrates a second through hole 4a, a second through hole 4b, a second through hole 4c, and a second through hole 4d as the plurality of second through holes 4.

The shape of the plurality of first through holes 2 in the plane parallel to the XY plane is, for example, a circle. However, the shape of the plurality of first through holes 2 in the plane parallel to the XY plane is not limited to a circle.

The shapes of the plurality of second through holes 4 are preferably grooves extending in the Y direction. As illustrated in FIG. 2, a plurality of second through holes 4 extending in the X direction may be provided.

A first width L1 of the first through hole 2 in the X direction is preferably larger than a second width L2 of the second through hole 4 in the X direction. The second through hole 4a preferably includes a first portion (first hole) 4a1 and a second portion (second hole) 4a2 provided above the first portion 4a1 and having a width in the X direction larger than a width of the first portion 4a1. For example, the width of the first portion 4a1 is the second width L2, and the width of the second portion 4a2 is L3. Similarly, the second through hole 4b preferably has a first portion (first hole) 4b1 and a second portion (second hole) 4b2. The second through hole 4c preferably has a first portion (first hole) 4c1 and a second portion (second hole) 4c2. The second through hole 4d preferably has a first portion (first hole) 4d1 and a second portion (second hole) 4d2.

The second width L2 of the second through hole 4 in the X direction is preferably larger than a width L6 of the dicing groove Y.

A heater (not illustrated) may be provided in the table 10 in order to soften the adhesive member 60 to facilitate peeling of the adhesive member 60 from the substrate W.

The container 80 is provided on the table 10. The container 80 has a second opening portion 82 and a joint 88.

The second opening portion 82 is provided at a lower part of the container 80. The second opening portion 82 has a second inner diameter d2 larger than a first inner diameter d1 of the first opening portion 72. Further, it can be in close contact with the annular frame 70. For example, a gasket groove 84 is provided in a lower face 90 of the container 80 in order to enable close contact. A gasket 86 is disposed in the gasket groove 84. The gasket 86 is in close contact with the annular frame 70, so that the container 80 can be in close contact with the annular frame 70. Here, the gasket 86 is not particularly limited, but, for example, can be preferably a rubber gasket, a polytetrafluoroethylene gasket, a metal gasket, or the like. In other words, the container 80 includes a first sidewall 83a inside the container 80 and a second sidewall 83b inside the container 80. The second sidewall 83b faces the first sidewall 83a. A distance between the first sidewall 83a and the second sidewall 83b in the X direction is d2.

The configuration in which the container 80 can be brought into close contact with the annular frame 70 is not limited to the above configuration.

The joint 88 is provided in the container 80. The joint 88 enables communication between the outside of the container 80 and the inside of the container 80. In FIG. 1, the joint 88 is provided at an upper part of the container 80. However, the joint 88 may not be provided at the upper part of the container 80.

For example, the container 80 is like a lid that can be in close contact with the annular frame 70, and overlaid on the annular frame 70. For example, the joint 88 is provided at the upper part of the lid.

The container 80 is made of metal such as aluminum or steel use stainless (SUS), for example.

In a state where the annular frame 70 having the first opening portion 72 to which the substrate W is fixed by the adhesive member 60 is disposed on the upper face 6, the plurality of first through holes 2 is decompressed using, for example, a dry pump (not illustrated) (A1). Similarly, the plurality of second through holes 4 is decompressed (A2) using, for example, a dry pump (not illustrated).

In addition, in a state where the second opening portion 82 of the container 80 is in close contact with the annular frame 70 to which the substrate W is fixed by the adhesive member 60, for example, a gas such as an inert gas is supplied into the container 80 using a gas pipe (not illustrated) connected to the joint 88 and a regulator (not illustrated). Accordingly, the inside of the container 80 is pressurized (A3). Therefore, the entire pieced substrate W is pressed downward, for example.

Next, a method for using the semiconductor manufacturing device 100 according to the embodiment will be described.

FIG. 4 is a flowchart illustrating a method of using the semiconductor manufacturing device 100 according to the embodiment.

First, the substrate W before being diced is fixed to the first opening portion 72 of the annular frame 70 by the adhesive member 60 (S2). Next, the substrate W is diced (S4).

Next, the annular frame 70 is disposed on the table 10. Here, the annular frame 70 is disposed such that the dicing groove Y formed by dicing is disposed above the second through hole 4 (S6). Furthermore, the annular frame 70 is disposed such that the substrate W pieced by dicing is disposed above the first through hole 2.

Next, the container 80 is disposed on the annular frame 70. Here, the container 80 is disposed on the annular frame 70 such that the second opening portion 82 is in close contact with the annular frame 70 (S8).

Next, the adhesive member 60 is heated by, for example, a heater provided in the table 10 (S10). For example, the heater may be turned on before the annular frame 70 is disposed on the table 10, so that the adhesive member 60 may be prepared to be heated.

Next, the plurality of first through holes 2 is decompressed (S12).

Next, the plurality of second through holes 4 is decompressed (S14).

The dry pump used for decompressing the plurality of first through holes 2 and the dry pump used for decompressing the plurality of second through holes 4 may be separately prepared. A pipe and a valve (not shown) are appropriately connected between the plurality of first through holes 2 and the plurality of second through holes 4, and one dry pump, and opening and closing of the valve is controlled, so that the plurality of first through holes 2 and the plurality of second through holes 4 can be decompressed by the one dry pump.

Next, the inside of the container 80 is pressurized (S16). As a result, the adhesive member 60 is peeled off from the burr Z (S18).

Next, the functions and effects of the semiconductor manufacturing device 100 according to the embodiment and the method of using the semiconductor manufacturing device will be described.

When dicing the substrate W using the dicing device, a phenomenon called chipping in which the end portion of the substrate W lacks, a phenomenon in which a crack occurs in the substrate W due to dicing, a phenomenon in which a burr occurs at the end portion of the substrate W, a phenomenon in which scraps of the adhesive member 60 occur, and the like may occur.

In addition, when the substrate W pieced by dicing is picked up using the pickup device, a phenomenon in which pickup fails (a phenomenon in which an acquisition rate or a pickup rate decreases), a phenomenon in which a crack occurs in the substrate W due to pickup, a phenomenon in which the end portion of the substrate W lacks, and the like may occur.

Furthermore, both the phenomenon caused by dicing and the phenomenon caused by pickup can be changed by selection of the adhesive member 60.

Therefore, it has been required to search for a condition for dicing and a condition for picking up while suppressing all of the above-described phenomenon that can occur by dicing and the above-described phenomenon that can occur by pickup in a well-balanced manner. However, even when a condition for suppressing the phenomenon that occurs at the time of dicing is found, it is not always possible to suppress the phenomenon that occurs at the time of pickup by such a condition. In addition, even when a condition for suppressing the phenomenon that occurs at the time of pickup is found, it is not always possible to suppress the phenomenon that occurs at the time of dicing by such a condition. Therefore, there is a problem that it is difficult to optimize the dicing condition and the pickup condition.

Figure 5A:
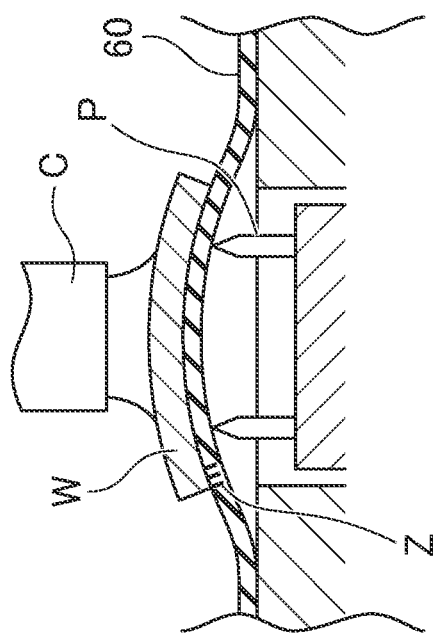
FIGS. 5A and 5B are diagrams for explaining the functions and effects of the semiconductor manufacturing device according to the embodiment and the method of using the semiconductor manufacturing device.
Figure 5B:
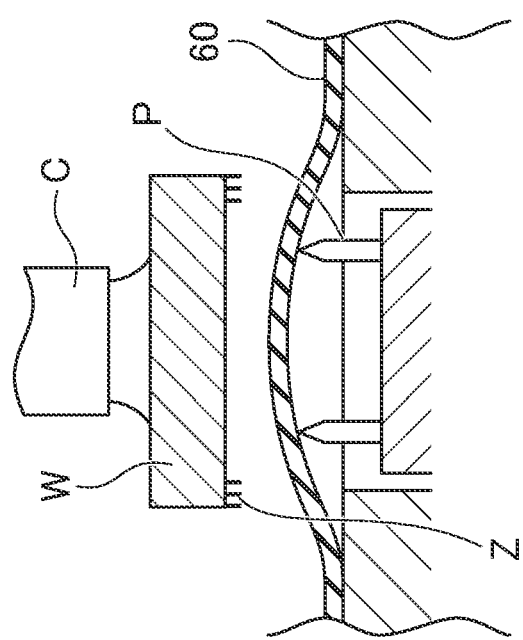

FIGS. 5A and 5B are schematic diagrams for explaining the functions and effects of the semiconductor manufacturing device 100 according to the embodiment and the method of using the semiconductor manufacturing device. FIG. 5A is a schematic diagram in a case where the thickness of the substrate W is thinner, and FIG. 5B is a schematic diagram in a case where the thickness of the substrate W is thicker.

The dicing is performed from the upper side to the lower side of the substrate W. Therefore, the burr Z is formed particularly on the lower face of the substrate W. Therefore, since the burr Z easily bites into the adhesive member 60, there is a problem that it is difficult to peel off the substrate W from the adhesive member 60.

Specifically, when a vertical metal-oxide-semiconductor (MOSFET) is formed on the substrate W as a semiconductor device, a metal electrode is formed on the lower face of the substrate W in many cases. Then, the burr Z contains the metal contained in the metal electrode at the time of dicing. In such a case, since the burr Z containing metal easily bites into the adhesive member 60, there is a problem that it is difficult to peel off the substrate W from the adhesive member 60.

In addition, as illustrated in FIG. 5A, in a case where the thickness of the substrate W is thinner, when the substrate W is picked up using the collet C, the adhesive member 60 is deformed convexly upward, and the substrate W is also deformed in accordance with the deformation of the adhesive member 60 because the elastic deformation rate is higher. On the other hand, as illustrated in FIG. 5B, when the thickness of the substrate W is larger, even when the adhesive member 60 is deformed convexly upward, the substrate W is hardly deformed in accordance with the deformation of the adhesive member 60 because the elastic deformation rate is lower. Therefore, the adhesive member 60 is more easily peeled off.

Therefore, when the thickness of the substrate W is thinner, there is a problem that it is more difficult to peel off the substrate W from the adhesive member 60. Specifically, when a vertical metal-oxide-semiconductor (MOSFET) is formed on the substrate W as a semiconductor device, the substrate W is preferably thinned in order to reduce the on-resistance. Therefore, there is a problem that it is further difficult to peel off the substrate W from the adhesive member 60.

Therefore, a semiconductor manufacturing device 100 according to an embodiment includes the table 10 having the upper face 6 on which the annular frame 70 having the first opening portion 72 to which the substrate W is fixed by the adhesive member 60 is disposed, the table 10 having a plurality of first through holes 2 penetrating the table 10 in a vertical direction and provided side by side in a first direction parallel to the upper face 6 and a plurality of second through holes 4 each provided between the adjacent first through holes 2 and penetrating the table in the vertical direction, and the container 80 provided on the table 10, the container 80 including the second opening portion 82 provided at a lower part of the container 80, having the second inner diameter d2 larger than the first inner diameter d1 of the first opening portion 72, and being capable of being in close contact with the annular frame 70, and a joint 88 allowing an outside of the container and an inside of the container 80 to communicate with each other.

In addition, the plurality of first through holes 2 and the plurality of second through holes 4 are decompressed in a state where the annular frame 70 having the first opening portion 72 to which the substrate W is fixed by the adhesive member 60 is disposed on the upper face 6, and the inside of the container 80 is pressurized using the joint 88 in a state where the second opening portion 82 is in close contact with the annular frame to which the substrate W is fixed by the adhesive member 60.

By decompressing the plurality of first through holes 2, the adhesive members 60 above the plurality of first through holes 2 are sucked. As a result, the pieced substrate W above the plurality of first through holes 2 is sucked. Therefore, a problem that the pieced substrate W is turned over on the upper face 6 and cannot be picked up hardly occurs. By decompressing the plurality of second through holes 4, the adhesive member 60 disposed above the second through holes 4 is pulled downward. Therefore, the adhesive member 60 is easily peeled off from the pieced substrate W, particularly from the burr Z. Further, by pressurizing the inside of the container 80, the adhesive member 60 is pushed downward via the dicing groove Y. Therefore, the adhesive member 60 is more easily peeled off from the pieced substrate W, particularly from the burr Z. In this way, peeling of the adhesive member 60 is promoted. Therefore, it is easier to optimize the dicing condition without considering the pickup condition and to optimize the pickup condition without considering the dicing condition. Therefore, it is possible to provide a semiconductor manufacturing device that facilitates optimization of the dicing condition and optimization of the pickup condition.

Each of the plurality of second through holes 4 is preferably a groove extending in the Y direction. The burr Z is formed along the dicing groove Y. Therefore, when the shape of each of the plurality of second through holes 4 is a groove extending in the Y direction so as to follow the shapes of the dicing groove Y and the burr Z, the peeling of the adhesive member 60 is further promoted due to the pressure reduction of each of the plurality of second through holes 4.

The first width L1 of the first through hole 2 in the X direction is preferably larger than the second width L2 of the second through hole 4 in the X direction. This is because it is preferable that the first width L1 of the first through hole 2 is larger in order to more firmly suck the pieced substrate W and then peel off the adhesive member 60. In other words, for example, when the adhesive member 60 is attempted to be peeled off using the second through hole 4 in a state where the first width L1 of the first through hole 2 is small and the pieced substrate W is not firmly sucked, the pieced substrate W turns over on the table 10 along with the peeling of the adhesive member 60, and the pickup by the pickup device may not be performed well.

The second through hole 4a preferably has the first portion 4a1 and the second portion 4a2 provided above the first portion 4a1 and having a width in the X direction larger than that of the first portion 4a1. This is because by providing the first portion 4a1 having a smaller width, the second through hole 4a can be rapidly decompressed, and the adhesive member 60 can be quickly peeled off. This is because the peeled adhesive member 60 easily fits inside the second portion 4a2. In other words, when the first portion 4a1 is not provided, the peeled adhesive member 60 may be pulled to the lower side of the table 10 due to the pressure reduction. In this case, the pieced substrates W are pulled together, and the pieced substrates W may be turned over on the upper face 6. This can be suppressed by providing the first portion 4a1 and the second portion 4a2. The same applies to the second through hole 4b, the second through hole 4c, and the second through hole 4d.

The second width L2 of the second through hole 4 in the X direction is preferably larger than a width L6 of the dicing groove Y. This is because when the second width L2 is L6 or less, the volume for decompression is too small, and it is difficult to properly peel off the adhesive member 60.

The semiconductor manufacturing device according to the embodiment and the method of using the semiconductor manufacturing device are more preferably applied when the thickness t of the substrate W is 75 μm or less. This is because when the thickness of the substrate W is thinner, it is more difficult to peel off the adhesive member 60 because the elastic deformation rate is larger.

According to the semiconductor manufacturing device according to the embodiment and the method of using the semiconductor manufacturing device, it is possible to provide a semiconductor manufacturing device and a method of using the semiconductor manufacturing device that facilitate optimization of a dicing condition and optimization of a pickup condition.

While certain embodiments have been described, these embodiments have been presented by way of example only, and are not intended to limit the scope of the inventions. Indeed, the semiconductor manufacturing device and the method of manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor manufacturing device comprising:
   a table having an upper face on which a frame having a first opening to which a substrate is fixed by an adhesive is disposed,
   the table having
      a plurality of first through holes penetrating the table in a vertical direction and provided side by side in a first direction parallel to the upper face and
      a plurality of second through holes each provided between the adjacent first through holes and penetrating the table in the vertical direction; and a container provided on the table,
the container including
a first sidewall provided on the frame,
a second sidewall provided on the frame, the second sidewall facing the first sidewall, a distance between the second sidewall and the first sidewall being larger than a first inner diameter of the first opening, and
a joint allowing an outside of the container and an inside of the container to communicate with each other.

2. The semiconductor manufacturing device according to claim 1, wherein
the first through holes and the second through holes are decompressed in a state where the annular frame having the first opening to which the substrate is fixed by the adhesive is disposed on the upper face, and
an inside of the container is pressurized using the joint in a state where the second opening is in close contact with the annular frame to which the substrate is fixed by the adhesive.

3. The semiconductor manufacturing device according to claim 1, wherein
each of the second through holes is a groove extending in a second direction intersecting the first direction, the second direction being parallel to the upper face.

4. The semiconductor manufacturing device according to claim 1, wherein
each of the second through holes has
a first portion and
a second portion provided above the first portion and having a width larger than a width of the first portion in the first direction.

5. The semiconductor manufacturing device according to claim 1, wherein
a first width of each of the first through holes in the first direction is larger than a second width of each of the second through holes in the first direction.

6. The semiconductor manufacturing device according to claim 1, wherein
the substrate has a plurality of dicing grooves disposed above the second through holes, and
a third width of each of the dicing grooves is larger than the second width of each of the second through holes.

7. The semiconductor manufacturing device according to claim 1, wherein
the substrate has a thickness of 75 µm or less.

8. A semiconductor manufacturing device comprising:
a table having an upper face on which an annular frame having a first opening portion to which a substrate is fixed by an adhesive is disposed,
the table having
a plurality of first through holes penetrating the table in a vertical direction and provided side by side in a first direction parallel to the upper face and
a second through hole provided between the two first through holes of the first through holes and penetrating the table in the vertical direction; and
a container provided on the table,
the container including
a first sidewall provided on the frame,
a second sidewall provided on the frame, the second sidewall facing the first sidewall, a distance between the second sidewall and the first sidewall being larger than a first inner diameter of the first opening, and
a joint allowing an outside of the container and an inside of the container to communicate with each other.

9. The semiconductor manufacturing device according to claim 8, wherein
the first through holes and the second through holes are decompressed in a state where the frame having the first opening portion to which the substrate is fixed by the adhesive is disposed on the upper face, and
an inside of the container is pressurized using the joint in a state where the second opening portion is in close contact with the annular frame to which the substrate is fixed by the adhesive.

10. The semiconductor manufacturing device according to claim 8, wherein
the second through hole is a groove extending in a second direction intersecting the first direction, the second direction being parallel to the upper face.

11. The semiconductor manufacturing device according to claim 8, wherein
the second through hole has
a first portion and
a second portion provided above the first portion and having a width larger than a width of the first portion in the first direction.

12. The semiconductor manufacturing device according to claim 8, wherein
a first width of each of the first through holes in the first direction is larger than a second width of the second through hole in the first direction.

13. The semiconductor manufacturing device according to claim 8, wherein
the substrate has a dicing groove disposed above the second through hole, and
a third width of the dicing grooves is larger than the second width of the second through hole.

14. The semiconductor manufacturing device according to claim 8, wherein
the substrate has a thickness of 75 µm or less.

* * * * *